United States Patent [19]
Belk

[11] Patent Number: 4,833,559
[45] Date of Patent: May 23, 1989

[54] CAPACITOR MULTIPLEXING FOR MAGNETORESISTIVE HEADS

[75] Inventor: Nathan R. Belk, Richfield, Minn.

[73] Assignee: Magnetic Peripherals Inc., Minneapolis, Minn.

[21] Appl. No.: 92,011

[22] Filed: Sep. 2, 1987

[51] Int. Cl.$^4$ .................. G11B 5/00; G11B 15/04
[52] U.S. Cl. ........................ 360/113; 360/61
[58] Field of Search ............... 360/113, 63, 61; 307/241, 242, 243, 246

[56] References Cited
U.S. PATENT DOCUMENTS

| | | | |
|---|---|---|---|
| 3,409,884 | 11/1968 | Guerth | 360/113 |
| 3,541,355 | 11/1970 | Kaw | 307/243 |
| 4,492,997 | 1/1985 | Arai et al. | 360/113 |

Primary Examiner—Vincent P. Canney
Attorney, Agent, or Firm—Joseph A. Genovese; Michael B. Atlass

[57] ABSTRACT

This patent teaches multiplexing MR head circuits to an off-chip capacitor in novel ways to eliminate excessive numbers of off-chip components. The bias current is switched off for each MR head when it is not in use and the bias current is supplied only to the MR head being employed at a given time. On the sensing side, the invention teaches connecting a single capacitor across a plurality of pairs of transistor emitters, each pair of transistors having their collectors (assuming NPN) connected to the sense lines of one of the MR heads. A number of example circuits are illustrated and described, including one employing PNP transistors.

9 Claims, 3 Drawing Sheets

CAPACITOR MULTIPLEXING FOR MAGNETORESISTIVE HEADS

This invention relates to the field of devices which employ magnetoresistive (herinafter "MR") heads for reading changes in ambient magnetic flux. It particularly relates to such devices wherein more than one MR head is employed, and is most useful when employed in magnetic data storage disk drive systems having several platters of data storage disks.

BACKGROUND

Magnetoresistive or MR heads are operated by sensing the change in resistivity (measured by changes in voltage) across a given area through which a bias current having a constant value is present.

Because of the DC voltage present across the MR head and because of the extreme sensitivity of the head to noise introduced to it through its bias current source, it has been found to be necessary to use at least one DC blocking capacitor per MR head circuit. (At least where an integrated circuit was used to feed the bias current to each MR head using the bypass capacitor. Otherwise a bias source capacitor was also required for each MR head.)

A single integrated circuit may be designed to provide all the support circuitry for all the MR heads on a data storage device arm. Where this is for four MR heads, at least five external (off-chip) capacitors or as many as twelve would be required. This would also require between nine and twelve extra chip leads to support the external capacitors. Capacitors of the small but appropriate size required are expensive and difficult to install in this type of hybrid circuit environment. It is expecially problematic because of reliability problems contributed by the added number of discrete element which would be assembled into the disk drive's head arm assembly. Increased contamination may also be a problem with the more numerous discrete components.

External capacitors are a requirement because the capacitance available on-chip for a read chip capacitor may only extend as high as 20 pf with today's technology. What is needed to accomplish the functions described is a capacitance on the order of 100,000 pf (or 0.1 micro farrads). The typical MR head responds to changes in ambient flux (which indicate data in the adjacent platter) with changes in voltage on the order of 0.2 millivolts. Clearly at these levels of sensitivity Johnson noise and shot noise (recombination noise) are going to be severe problems without the use of the off-chip capacitors. As described above, the prior art would isolate each MR head with at least one off-chip capacitor.

By multiplexing a single outside capacitor for all circuit bias current sources and a single capacitor for all head amplifiers, the total external component count is reduced to two. This does, unfortunately, result in the limitation that only one of the many heads which must use the off-chip capacitor can operate at one time. (This limitation may be overcome by wiring the chip with a plurality of capacitors or by using a plurality of chips.) With this invention, therefore, most of the read/write circuitry on the arm is switched off when not in use.

SUMMARY OF THE INVENTION

This patent teaches multiplexing MR head circuits to an off-chip capacitor. The bias current is switched off for each MR head when it is not in use and the bias current is supplied only to the MR head being employed at a given time. On the sensing side, the invention teaches connecting a single capacitor across a plurality of pairs of transistor emitters, each pair of transistors having their bases (assuming NPN) connected to the sense lines of one of the MR heads. A number of example circuits are shown.

BRIEF DESCRIPTION OF THE DRAWINGS

FIG. 2a uses NPN transistors and FIG. 2b provides the same functionality using PNP transistors.

DETAILED DESCRIPTION OF THE PREFERRED EMBODIMENTS

Figure 1:
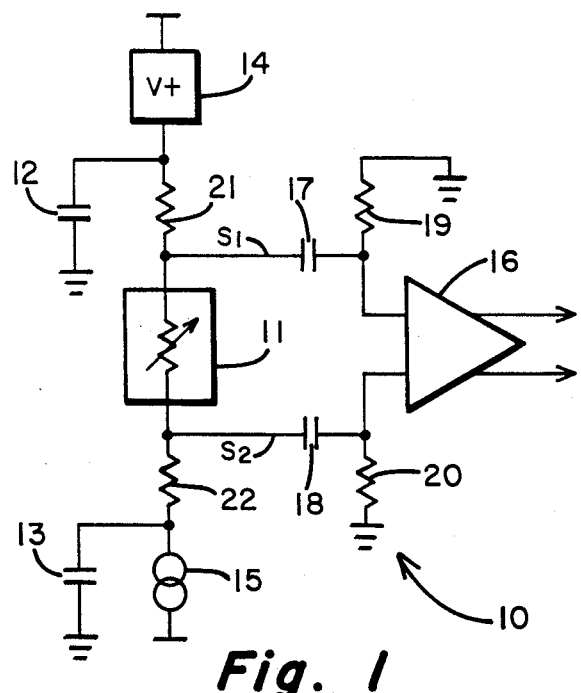
FIG. 1 is a heuristic circuit drawing exemplifying a typical MR head circuit.

In FIG. 1 a circuit 10 is shown which broadly illustrates the usual electronic arrangement for use of magnetoresistive (MR) heads. Bias capacitors 12 and 13 tied to ground and the resistors 21 and 22 operate to islolate the MR head 11 from noise in the voltage and current sources 14 and 15 and balance the impedences looking into the sense lines from the head to provide for a high common mode rejection ratio. The capacitors 17 and 18 and resistors 19 and 20 are used to filter off the D.C. offset associated with an MR head used in this fashion. Preamplifier 16 provides amplified output useable to measure the changes of resistance in the MR head (presumably due to the presence of changing magnetic flux in its vicinity). Methods of useing this signal for data reading are beyond the scope of this disclosure. It should be noted that any current drain described in detail below could be simply a ground or low impedence voltage source. It was desirable to have a "switch" on each side of the MR head so a simple ground was not used with the preferred embodiments.

Figure 2A:
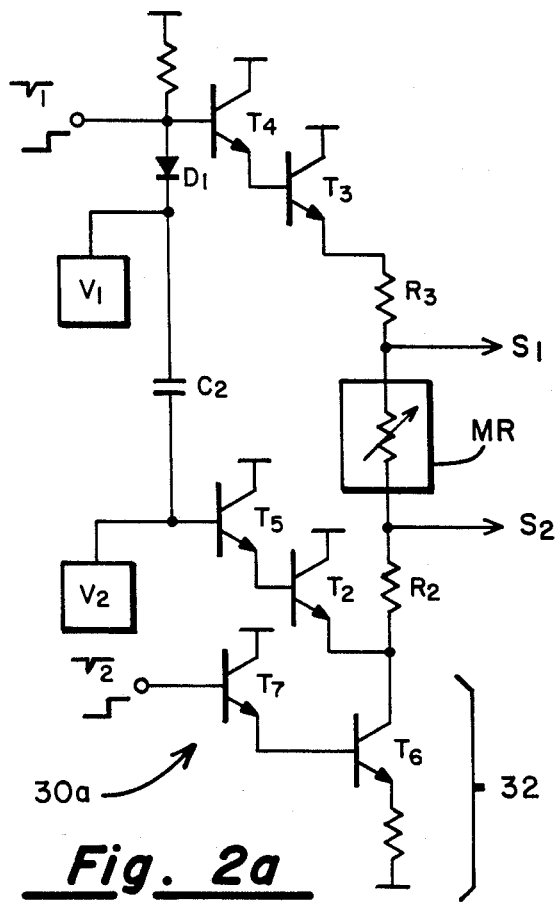
FIGS. 2a and 2b are alternate embodiment circuit diagrams to that of FIG. 3.

FIG. 2a describes a basic circuit unit 30a which can be used for each MR head. The amplifier and circuitry for reading the head resistance changes are not shown. The circuit operates by placing a constant low noise voltage across two large valued resistors in series with the head. These resistors ensure a constant current through the MR element and also ensure a balanced preamplifier input. In this circuit 30a, the function of current source 32 is to sink enough current to maintain proper MR head bias current and to sink the additional current necessary to keep $T_2$ turned on. Because the dynamic impedance looking into the emitter of $T_2$ is substantially less, by more than an order of magnitude, than the impedance of the resistor string $R_2$, MR, $R_3$, any noise introduced into the circuit from the current source 32 is shunted around the resistor string into transistor $T_2$.

The voltage of the emitters of $T_2$ and $T_3$ are themselves made quiet by ensuring that there are no noise voltages across their bases. This is accomplished with the aid of capacitor $C_2$.

In this bias circuit 30a the head current is turned on and off by controlling the voltage at the base of transistor $T_6$. The DC voltage of the head is controlled by the potential at the base of $T_3$. When the base of transistor $T_4$ is brought low, diode $D_1$ is reverse biased and is a very high impedance. This impedance isolates this section of the circuit from any MR head bias section which might then be turned on. When the base of $T_4$ is allowed to go high $D_1$ turns on and has a low impedance, effectively connecting the base of $T_4$ to capacitor $C_2$ and eliminating any noise voltage that might be coupled into that point. The circuits of FIGS. 2a and 2b may be referred to as "voltage mode" circuits to distinguish them from the type of circuit used in FIG. 3. They are called voltage mode because the head current is set by fixing the voltage difference between $V_1$ and $V_2$ which will in turn fixes the DC voltage across the resistor string.

Figure 2B:
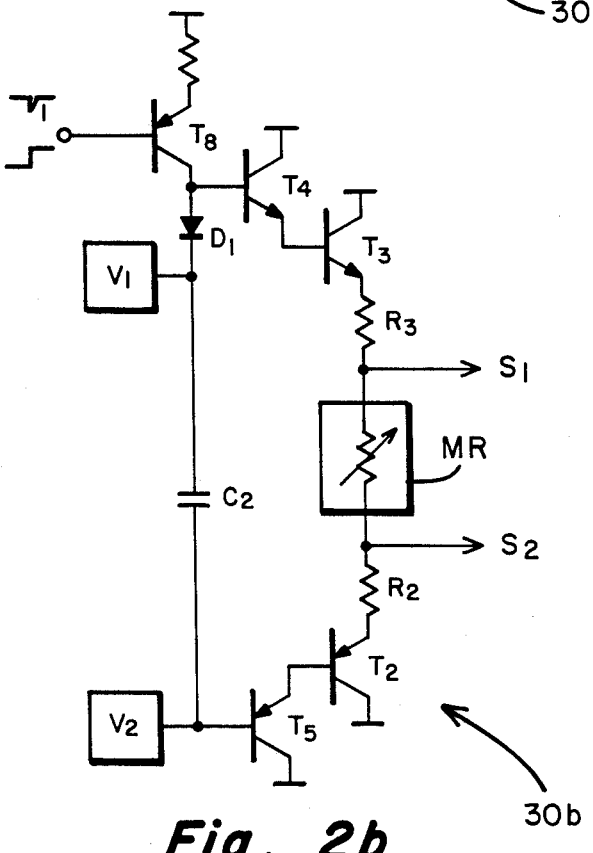

The circuit 30b in FIG. 2b is another circuit in which the voltage difference between the emitters of the two transistors $T_2$ and $T_3$ controls the bias current. This circuit allows for implementation using high performance PNP transistors. In this circuit the bias current is again established by the voltage difference across the resistor string $R_2$, MR, $R_3$, but here transistor $T_2$ is a PNP device which not only acts to apply a low noise voltage to the bottom of the resistor string but also to provide a current sink for the head bias current. As in circuit 30a the nominal operating voltage of the head is determined by the voltage of the base of transistor $T_4$ and again the state of diode $D_1$ establishes which head is electrically coulpled to the bypass capacitor $C_2$. Circuit 30b can be turned on or off by controlling the current through $D_1$ via transistor $T_8$. This arrangement provides for the ability to share capacitor $C_2$ among a plurality of MR head bias circuit units, as can circuit 30a. Simple modifications may also be employed which would be obvious to one of ordinary skill in this art including for example, eliminating transistors $T_4$ and $T_5$ if desired in both circuits 30a and 30b, since they merely provide current gain.

Figure 3:
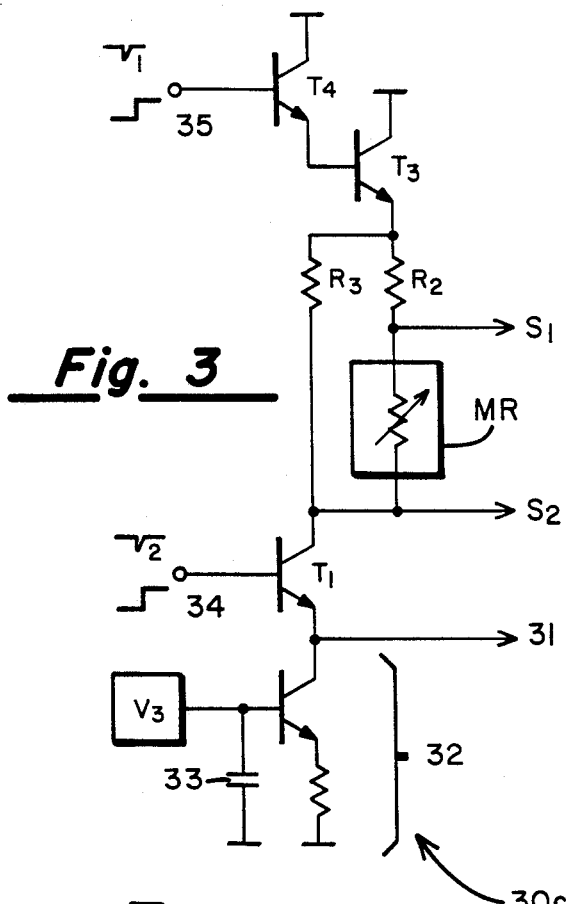
FIG. 3 is a circuit diagram illustrating a single MR head circuit attached to a current supply which can be switched to other similar units in accord with this invention.

A different implementation of the ability to share a bypass capacitor among a number of MR head circuit units 30c is illustrated in FIG. 3. For ease of reference circuits like it are called current drain shunting circuit units. The amplifier and circuitry for reading the head resistance changes (available across lines $S_1$ and $S_2$) are againt not shown. A single bias current source 32 is provided for each MR head circuit unit, and is available to the other across line 31 when required. With circuit 30c a single bias current source and bias capacitor 33 can be used for all MR heads.

This circuit unit is made operable by the input of a voltage $v_2$ applied to the base of transistor $T_1$ at 34 and $v_1$ is applied to $T_4$ at 35. The positive voltage applied to the base of $T_1$ steers the circuit through the MR element while the voltage $v_1$ applied to the base of $T_4$ raises the DC potential of the head.

When the voltages $v$ are removed, the transistor $T_1$ is switched off, the voltage at the base of $T_4$ is lowered and the current source 32 is available for to other MR head circuit units across line 31.

In this circuit 30c, because of the necessity of matching the impedances of $R_2$ $R_3$, (to ensure that the circuit has a high common mode rejection ratio) the current produced by current source 32 must be great enough to allow for proper head bias current and for an additional amount through $R_3$ which is slightly greater than the MR head current. Thus, current source 32 must generate slighlty more than twice the head operating current which can lead to excessive chip power dissapation. Therefore if a large bias current is required for the MR head being used when the circuits 30a or 30b or some derivative thereof would be preferred.

Figure 5:
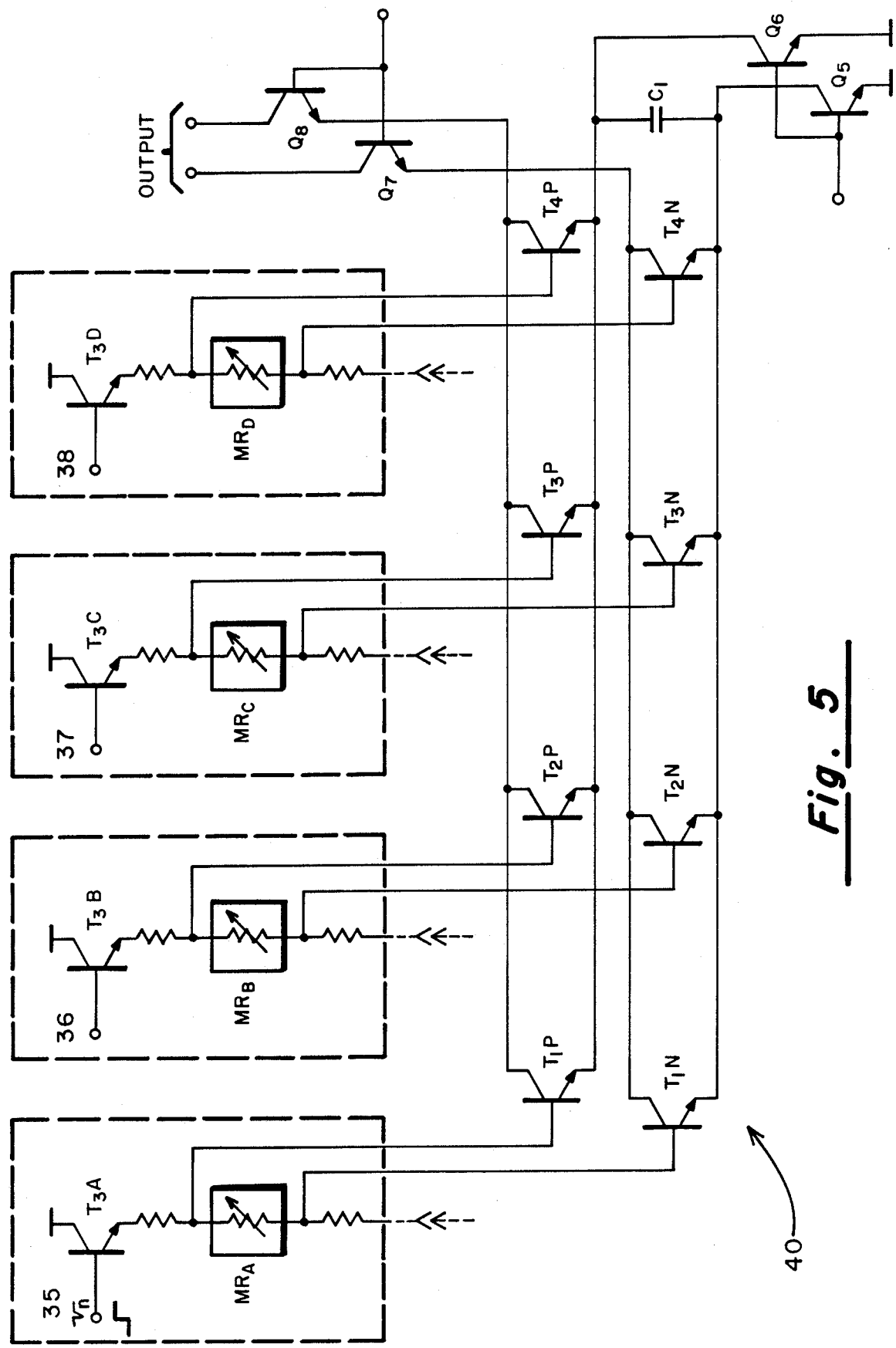
FIG. 5 is a partial circuit diagram detailing the signal switching between MR heads through a single blocking capacitor.

FIG. 5 illustrates an example of the preferred embodiment circuit 40 for employing a single off-chip capacitor to provide DC blocking for the sense amplifiers necessary for MR head signals produced by the circuits described with reference to FIGS. 3, 2a, and 2b. It may be said to substitute the one capacitor $C_1$ for capacitors 17 and 18 of FIG. 1, and to provide it for a multiplicity of MR head circuit units.

FIG. 5 illustrates a circuit for switching the blocking capacitor $C_1$. The bias circuit unit already described all share the characteristics that the DC potential of the MR element is raised when the head is active and lowered while the head is idle. The concept embodied in circuit 40 is that of using the DC voltages present at the head to determine which of the MR head signals is coupled through capacitor $C_1$ and thereby passed on to the preamplifier. This DC voltage at the head is reflected in the bases of the input transistors $T_xN$, $T_xP$ (where $T_xN$ and $T_xP$ represent any pair of adjacent input devices).

The Circuit 40 functions as follows. The MR head selection is made here by input of a voltage $v_n$ 35, 36, 37 or 38. Assuming the bias current is flowing, as it would be if the circuits of FIG. 2b are employed, that input will allow current to flow through the head and the selected transistor $T3_A$, $T3_B$, $T3_C$, or $T3_D$. Using one of the other circuits or something similar requires the other voltage input concurrently. Note that much of the support circuitry for the MR head circuit units is not shown in this fure. Any circuit similar to those illustrated as circuits 30a, 30b, and 30c may be substituted for that shown in dotted outlines in this figure.

Whichever head is active goes to a higher potential than any of the unselected heads. When this occurs the bases of the transistors connected to the active device go high. These active devices are then the only devices capable of sourcing the current necessary to satisfy the transistor $Q_5$ and $Q_6$. Because of this, they are turned on while the other pairs are turned off because their emitter base junctions are held in reverse bias. The active pair transmits their AC (rapidly changing) signals through the low impedance path, including capacitor $C_1$ and upward into the circuitry accessed through the collectors of the pair $T_xN$, $T_xP$. Thus the selected MR head output is coupled through the off-chip capacitor $C_1$ and only its signal is provided as output.

Several modifications may easily be made to the illustrated circuit 40 without going beyond the teachings of this invention. Included among these would be using some other current source on either side of $C_1$ instead of transistors $Q_5$, and $Q_6$; or eliminating $Q_7$, and $Q_8$.

Figure 4:
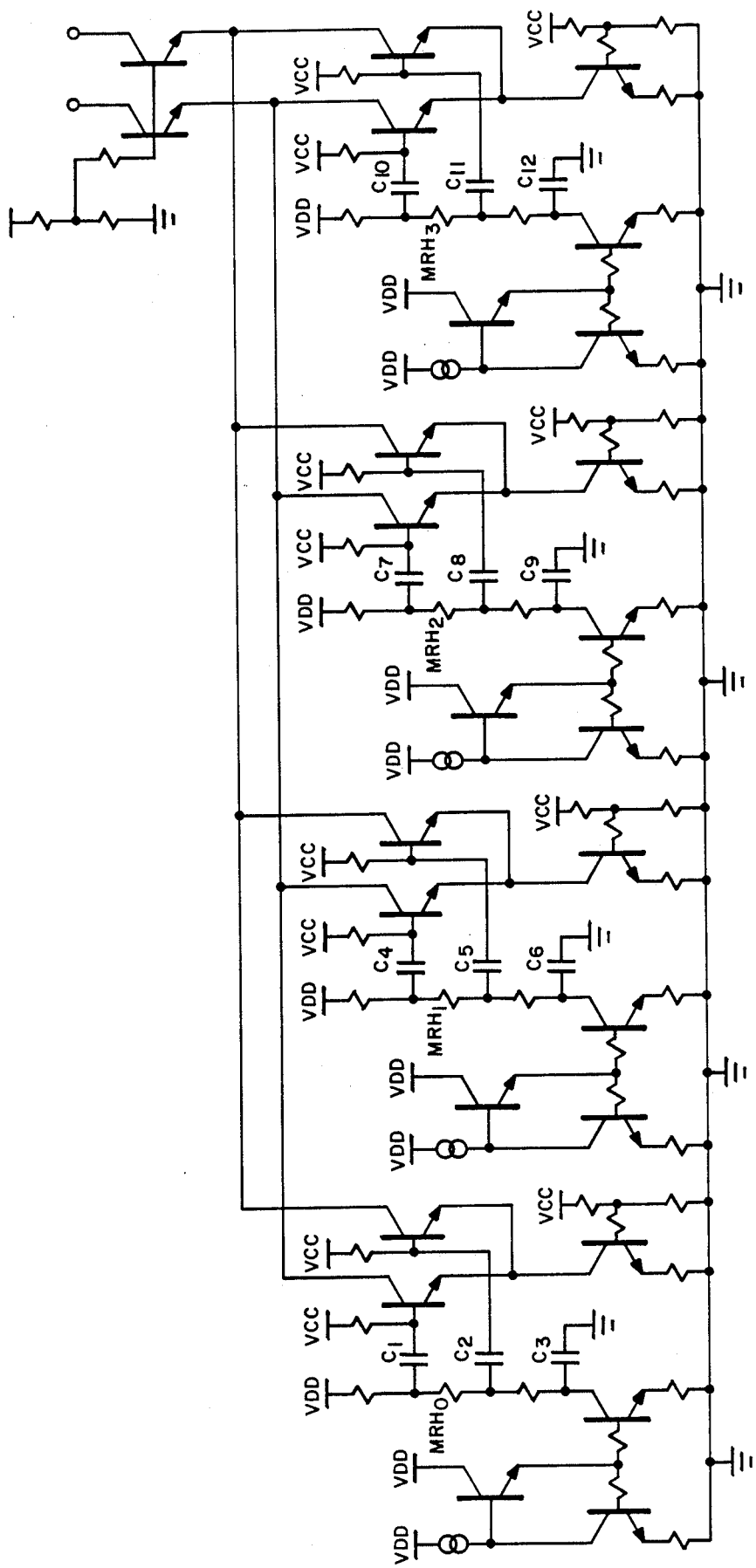
FIG. 4 is a circuit diagram of a prior art design employing capacitors for each MR head.

FIG. 4 illustrates what a circuit performing the function of that of circuit 40 would look like prior to this invention. Note the proliferation of capacitors.

I claim:

1. A circuit for sharing a single capacitor among a plurality of pairs of transistors, each pair comprising a left and a right transistor, wherein all of the emitters of the left transistors of each of the pairs is tied to one side of the capacitor and all of the emitters of the right side of each of the pairs is tied to the other side of the capacitor said circuit having:

means for selectively turning on one of the transistor pairs while simultaneously reverse biasing the emitter-base junction of the rest of the transistor pairs.

2. A circuit as set forth in claim 1 for use with a multiplicity of MR heads wherein a plurality of voltage mode circuit units are employed to accept a voltage input to selectively turn on the individual voltage mode circuit unit receiving said input voltage, wherein said voltage mode circuit includes two different voltage reference sources tied to a bypass capacitor and wherein one side of the capacitor is tied to the current source origin and one is tied to the current source drain for biasing one MR head in said voltage mode circuit unit.

3. A circuit as set forth in claim 2 wherein the voltage mode circuit includes at lesat one current originating transistor and one resistor in series, with the current originating transistor base connected to one side of the bypass capacitor and the current originating tranistor emitter in electrical connection with the resistor which is in turn in electrical connection with a first side of the MR head.

4. A circuit as set forth in claim 3 wherein the second side of the MR head is tied to a second resistor which is in turn in electrical connection with the emitter of at least one current flow transistor whose base is in electrical connection with the other side of said bypass capacitor.

5. A circuit as set forth in claim 4 wherein the emitter of the current flow transistor is also in electrical connection with a current drain which is activated by said input voltage.

6. A circuit as set forth in claim 1 wherein a current drain shunting circuit unit is employed for each MR head to accept a voltage input to selectively turn on the individual current drain shunting circuit unit receiving said input voltage, wherein said current drain shunting circuit unit includes switch means for providing an electrical path for the bias current to the current drain.

7. A current drain shunting circuit unit to accept a voltage input to selectively turn the current drain shunting circuit unit on, wherein said current drain shunting circuit unit includes switch means for providing an electrical path for the bias current to the current drain, and a resistor and an MR head connected in parallel between said switch means and a current origin.

8. A voltage mode circuit unit to accept a voltage input to selectively turn the voltage mode circuit on, wherein said voltage mode circuit includes two different voltage reference sources tied to a bypass capacitor and wherein one side of the capacitor is tied to a current origin and one is tied to a current drain for biasing an MR head in said voltage mode circuit unit.

9. A circuit for sharing a single capacitor among a plurality of pairs of transistors, wherein a single DC blocking capacitor is multiplexed among pairs of transistor emitters, so arranged and disposed that the emitters of one transistor of each pair is selectably connectable to one side of the capacitor at the same time that the other transistor of the selected pair is connected to the other side of the capacitor and wherein when one pair is selected all other transistor pairs sharing the capacitor are reverse biased.

* * * * *